US006297155B1

(12) United States Patent
Simpson et al.

(10) Patent No.: US 6,297,155 B1
(45) Date of Patent: Oct. 2, 2001

(54) METHOD FOR FORMING A COPPER LAYER OVER A SEMICONDUCTOR WAFER

(75) Inventors: Cindy Reidsema Simpson; Robert Douglas Mikkola; Matthew T. Herrick; Brett Caroline Baker, all of Austin; David Moralez Pena, Buda; Edward Acosta, San Marcos; Rina Chowdhury, Austin; Marijean Azrak, Austin; Cindy Kay Goldberg, Austin; Mohammed Rabiul Islam, Austin, all of TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/305,093

(22) Filed: May 3, 1999

(51) Int. Cl.[7] .................................................. H01L 21/44
(52) U.S. Cl. .............................. 438/687; 438/14; 438/17; 438/676
(58) Field of Search ................................ 438/687, 14, 17, 438/676, 653, 654; 205/157, 159, 105

(56) References Cited

U.S. PATENT DOCUMENTS

| 4,046,649 | * | 9/1977 | Elco et al. ............................. 204/58 |
| 4,287,043 | * | 9/1981 | Eckert et al. ....................... 204/228 |
| 4,514,265 | | 4/1985 | Rao et al. ............................. 204/15 |
| 5,007,993 | * | 4/1991 | Hull et al. ........................... 204/228 |
| 5,273,642 | | 12/1993 | Crites et al. ........................ 205/118 |
| 5,605,615 | * | 2/1997 | Goolsby et al. ...................... 205/83 |
| 5,662,788 | * | 9/1997 | Sandhu et al. ....................... 205/87 |
| 6,074,544 | * | 6/2000 | Reid et al. . |

FOREIGN PATENT DOCUMENTS

| 2214520A | * | 9/1989 | (GB) | ............................. C25D/5/18 |
| 02187032 | * | 7/1990 | (JP) . | |
| WO98/27585 | * | 6/1998 | (WO) . | |

OTHER PUBLICATIONS

Mandich, "Pulse and Pulse–Reverse Electroplating," pp. 382–387, HBM Engineering Co., Lansing, Il.*
"Measuring Plating Uniformity," IBM Technical Disclosure Bulletin, IBM Corp. pp. 127–129 (1995).*
Mikkola et al., "Bath Additive and Current Density Effects on Copper Electroplating Fill of Cu Damascene Structures," Materials Research Society, pp. 399–405 (1999).
Bai et al., "Copper Interconnection Deposition Techniques and Intetgration," IEEE, pp. 48–49 (1996).

* cited by examiner

*Primary Examiner*—Caridad Everhart
(74) *Attorney, Agent, or Firm*—Robert A. Rodriguez; Keith E. Witek (57) ABSTRACT

A method for electroplating a copper layer (118) over a wafer (20) powers a cathode of an electroplating system (10) in a manner that obtains improved copper interconnects. A control system (34) powers the cathode of the system (10) with a mix of two or more of: (i) positive low-powered DC cycles (201 or 254); (ii) positive high-powered DC cycles (256 or 310); (iii) low-powered, pulsed, positive-power cycles (306 or 530); (iv) high-powered, pulsed, positive-powered cycles (212, 252, 302, or 352); and/or (v) negative pulsed cycles (214, 304, 510, 528, or 532). The collection of these cycles functions to electroplate copper or a like metal (118) onto the wafer (20). During electroplating, insitu process control and/or endpointing (506, 512, or 520) is performed to further improve the resulting copper interconnect.

42 Claims, 8 Drawing Sheets

METHOD FOR FORMING A COPPER LAYER OVER A SEMICONDUCTOR WAFER

FIELD OF THE INVENTION

The present invention relates generally to semiconductor manufacturing, and more particularly to a method for electroplating copper on a semiconductor substrate to form inlaid copper interconnects.

BACKGROUND OF THE INVENTION

Currently semiconductor devices are requiring higher current densities in order to obtain higher performance. In addition, device dimensions are shrinking to geometries that are becoming increasingly problematic when conducting these higher current densities. The higher current densities and shrinking geometries must be accommodated in the art while simultaneously maintaining adequate levels of resistance to electromigration (EM), reduced metal voiding, improved wafer manufacturing throughput, while also avoiding other common reliability problems. While aluminum is a mature integrated circuit (IC) interconnect material, copper is a relatively new material for use in IC interconnects.

One of the most promising methods for depositing copper (Cu) on a substrate is through use of plating methods, such as electroplating. Electroplated copper provides several advantages over aluminum when used in integrated circuit (IC) applications, where a primary advantage is that copper is less resistive than aluminum-based materials and therefore capable of higher frequencies of operation. In addition, copper is more resistive to conventional problems associated with electromigration (EM) than is aluminum. The increased resistance to electromigration that is present when using copper provides an overall improvement in the reliability of semiconductor devices because, over time, circuits which have higher current densities and/or lower resistance to EM will have a tendency to develop voids or open circuits in their metallic interconnects. These voids or open circuits can cause the device to catastrophically fail in the field or during burn-in.

However, the integration of copper into the IC manufacturing process also introduces new problems, and is by no means completely optimized in terms of reliability or for high volume production. For example, it has been found that if copper is deposited too quickly into high aspect ratio openings using an electroplated bath that has a very high applied current or potential, substantially only in the direct current (DC) mode, problems are encountered with void regions or keyholes being formed in the copper interconnect. In these plating conditions, the deposited copper eventually pinches off at upper portions of the opening to create a copper-encapsulated air region or void in the incrementally-deposited copper film. Also, high current density, DC mode, plating of copper results in high deposition rates and produces a copper film that has degraded resistance to electromigration (EM) due to poor incorporation of electroplating impurities into the plated Cu film.

In addition, effective electroplating of the copper is highly dependent upon the quality of the underlying film. If the underlying copper seed film is not uniformly deposited or contains regions with insufficient amounts of seed material, the copper will not uniformly deposit in these areas and may cause reduction in IC yield and/or IC reliability issues. Typically, the copper plating's sensitivity to underlying seed layer quality increased when using low throughput, low DC plating methodologies. Therefore, regardless of whether high or low DC methods are used, one or more serious copper plating problems seem to be unavoidable in the final structure.

Therefore, a method for electroplating copper interconnects with adequate manufacturing throughput while simultaneously ensuring reduced or eliminated void formation, improved resistance to electromigration (EM), improved uniformity, and/or like advantages is needed in the semiconductor industry.

In addition to electroplating reliability, performance, and yield problems, conventional methods for depositing copper generally require electroplating the copper on the substrate using a fixed time deposition. Typically, a test wafer is processed through the electroplating chamber under specified conditions to determine if the process is operating within specification or control limits. If the system is operating within its limits, fixed time deposition processing of subsequent product wafers can begin for a period of time. This test wafer process control method assumes that subsequent product wafers will be in specification or within control limits by virtue of the assumption that the deposition conditions will hopefully remain unchanged over time.

The overall method of processing test wafers, determining static conditions by which the test wafers obtains good results, and then processing the wafer statically by these conditions with the hope of continued success is both time consuming, unreliable, and expensive. Therefore, it would be beneficial to provide copper electroplating systems which could in-situ endpoint or monitor electroplating operations in real time so that plating operations can be computer controlled dynamically during plating whereby test wafer usage and wafer scrap is reduced, throughput is further optimized, and film performance is improved.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Generally, the present invention is a method and apparatus for controlling a cathode and/or an anode of a copper electroplating chamber in order to improve the quality of a copper (Cu or Cu alloy) interconnect formed on a semiconductor wafer via copper electroplating operations. It has been found that various sequences of pulsed positive and/or negative current waveforms along with the inclusion of various optional direct current (DC) bias periods supplied to a cathode and/or an anode of a copper electroplating chamber can adversely have an effect on one or more of copper uniformity, copper resistance to electromigration (EM), plating throughput, copper voiding, copper grain structure, and/or other like properties.

The improved copper electroplating method taught herein can be better understood with specific references to FIGS. 1–13 herein.

Figure 1:
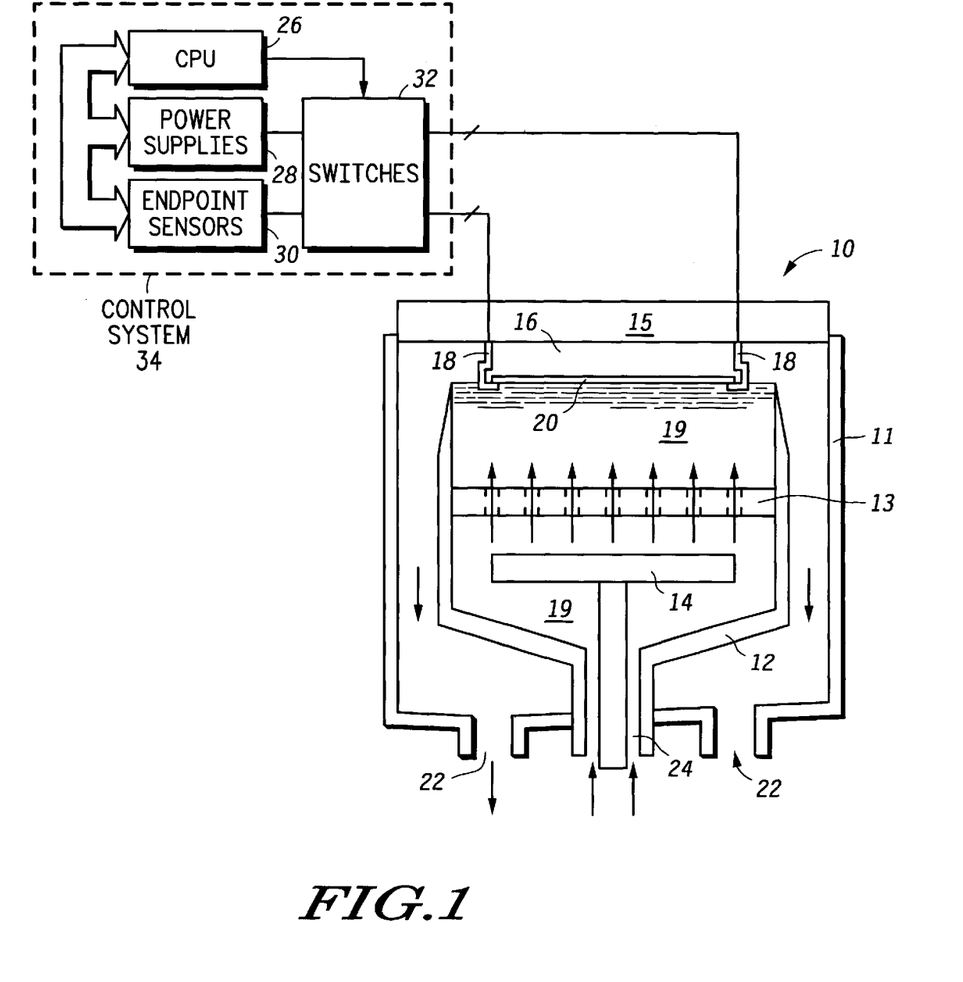
FIG. 1 illustrates, in a mixed cross-sectional and electrical block diagram, an electroplating chamber and its associated computer control system that is used to electroplate copper material onto a semiconductor wafer.

FIG. 1 illustrates a cross-sectional view of an electroplating system or chamber 10. The chamber 10 is coupled to a block diagram representation of a computer control system 34 that is used to electrically, chemically, and mechanically control the operation of the chamber 10. The system 10 includes a chamber assembly or housing 11. Housing 11 has one or more outlet ports 22 for draining excess electroplating fluid from the chamber 10 over time. The system 10 further includes an inner cup 12 that has an inlet port 24 for receiving incoming plating fluid 19 which may include one or more of brighteners, carriers, levelers, and/or like plating additives. The cup 12 may contain a central diffuser 13. The diffuser 13 is generally used to provide some electrical isolation between an anode 14, and a wafer 20 or cathode assembly of the chamber 10. The cathode in FIG. 1 is collectively one or more of the wafer 20, the clamps 18, and/or the turntable 16. In addition, the diffuser 13 may be used to reduce fluid turbulence against the wafer 20 and improve impurity/concentration uniformity or distribution in the solution 19.

The anode 14 lies between the bottom portions of cup 12 and the diffuser 13 and is powered by a power supply not specifically shown in FIG. 1. Note that control of the both the cathode and anode in FIG. 1 may be done by the same computer 34 or by different computers. While the anode 14 is generally controlled by static DC biasing during plating operations, the anode 14 taught herein may be controlled by pulsed direct current (DC) or may be changed between the DC and/or pulsed current (I) or voltage (V) over time during electroplating periods to change electroplating rates (i.e., throughput), influence copper film grain size, and/or alter other properties of the electroplated copper film or process. Note that DC, power, voltage and current may be used interchangeably herein since all of these factors are somehow associated with power.

Therefore, it is important to note that while cathode electrical control is generally taught herein (see FIGS. 8–13), such techniques may be generally applied to the anode of FIG. 1 in some circumstances. The system 10 further includes a head 15 that includes a turntable 16 and one or more clamp fingers or rings 18. The entire assembly (including one or more of wafer 20, clamps 18, and/or table 16) is powered as the cathode for the system 10. Cathode assembly components are typically made of platinum or platinized titanium where possible for such biasing purpose. The turntable 16 is generally machine, computer, and/or motor controlled to allow for wafer rotation during plating, but such rotation is not always required during some plating operations.

The cathode (e.g., one or more of the wafer 20, clamps 18 and/or turntable 16) is powered and/or electrically monitored using the control system 34 of FIG. 1. Control system 34 is any type of computer control device, but generally includes a central processing unit (CPU) 26 of some sort. The CPU 26 controls switches or logic 32, which in turn controls how and when current and/or voltage (i.e., power) is provided to the cathode from one or more power supplies 28. The power supplies 28 (which may be one or more supplies) may provide direct current (DC) levels of power or pulsed DC waveforms over a wide range of currents and/or voltage levels. In addition, the supplies 28 may be designed to provide alternating current (AC) waveforms including, but not limited to, sawtooth power waveforms, sinusoidal waveforms, logarithmic waveforms, exponential waveforms, or any other type of power/time control to the cathode of FIG. 1. In addition, the supplies 28 may provide square wave waveforms having on times or off times of different power magnitudes and/or different duty cycles. Further, the supply 28 may provide any of these waveform or current/voltage/power levels in either a negative or positive polarity or some combination thereof. Such power is provided via the supplies 28 to the clamps 18 of FIG. 1.

The same clamps 18 that are used to supply power may also be the same clamps that are occasionally coupled to the endpoint detection sensors to perform electroplate monitoring. In another form, dedicated endpoint clamps or probes 18, which are coupled for control by circuit 30 only and not for control by supplies 28, may be used to periodically or continuously monitor an electrical property of the wafer 20 to provide insitu electroplating control while other clamps 18 that are coupled to supplies 18 perform electroplate biasing of the wafer 20.

As an example of how the device 30 functions through the clamps 18 or another contact mechanism, the sensors 30 or power supplies controlled thereby may apply a fixed voltage to the wafer 20 and measure a resulting current. The I-V data resulting therefrom may be used to determine resistance R of the incrementally depositing Cu film whereby R estimates may be correlated to thickness of the Cu film via $R=\sigma l/A$. Since I and V can be used to determine R, since the conductivity ($\sigma$) or inverse of resistivity of Cu is known, and since the effective length (l) between any two endpoint measurement clamps 18 is fixed by the chamber design, A is the only variable. A is the cross sectional area through which the current will flow and is a direct function of thickness (t) of the depositing Cu film. Therefore, as A increases, such increase is due to an corresponding increase in the thickness, whereby R can be mapped to A and then to thickness (t) to accommodate endpoint detection.

In another form, the circuits 30 may apply a fixed current (I) to the wafer 20 and measure a resulting voltage (V). Such I-V or V-I processes may be time multiplexed with the power supply 28 into the same clamps 18 or may be affixed to separate dedicated endpoint clamps 18. By measuring some electrical property of the wafer 20 over time, the unit 30 may accurately determine when to endpoint the electroplating process since the thickness of the conductive deposited copper film on the wafer over time may be easily correlated to the measured wafer resistance or other measured electrical property. In addition, the wafer 20 may be monitored from several directions across the surface of the wafer, or between several different pairs of separately-positioned clamps 18, whereby a two-dimensional map of resistance (and thus a 2-D map of electroplated thickness) across the wafer can be obtained by computer to generate real-time uniformity data during Cu or Cu alloy electroplating. Such uniformity information may be used by the CPU 26 to optimize power 28 insitu to deposition in order to improve uniformity, or the uniformity data may be used to flag a machine for maintenance or engineering repair on occasion.

Therefore, during the operation of the system 10, the plating solution 19 enters the cup 12 through the inlet port 24 and exits through the outlet port 22. The anode 14 is oxidized and copper is plated onto the cathode via signals provided by the control system 34. During plating, the control system 34 controls cathode and/or anode power (i.e., by selectively changing a supply of current and/or voltage over time) to improve the quality and characteristics of the deposited copper on the wafer 20. Endpoint detection and further control of the plating process may also be performed in an insitu manner using the endpoint sensors and circuitry 30.

In summary, the anode 14, the clamp fingers 18, and the substrate wafer 20 (i.e., cathode) are biased using one more of control systems 34 to plate the substrate 20 with copper wherein the method of biasing of the elements 14, 18, and/or 20 via the computer system 34 has a significant impact on one or more of wafer throughput, reduction or elimination of copper void formation, reduction of Cu pinch-off, improved film uniformity, and/or improved resistance to electromigration (EM). Generally, it has been found that improved film characteristics, improved reliability, and/or enhanced performance has resulted when using one or more of the electroplating cathode biasing techniques discussed subsequently via FIGS. 8–13 herein.

Figure 2:
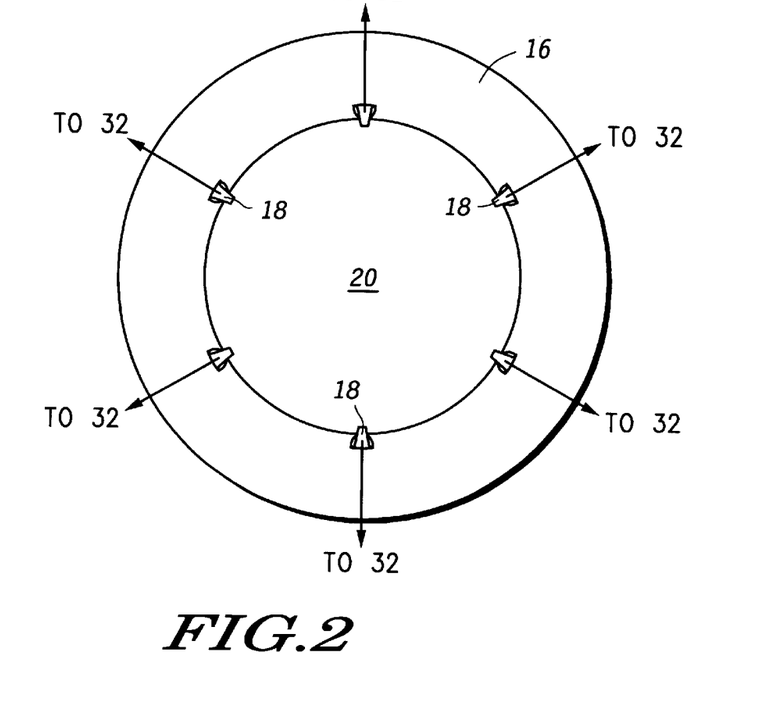
FIG. 2 illustrates, in a top-prospective view, the cathode assembly (i.e., wafer, turntable, and clamps) of FIG. 1.

FIG. 2 illustrates a top perspective view of the cathode assembly previously shown in a cross-sectional manner in FIG. 1. FIG. 2 shows the wafer 20, the turntable/headplate 16, and six clamps 18. While FIG. 2 shows six clamps, it should be noted that it is possible to use one large clamp ring in place of the six finger clamps in FIG. 2. It is also possible to use any number of finger clamps (e.g., three, ten, forty, one hundred, etc.) around a perimeter surface of the wafer 20 in FIG. 2. FIG. 2 shows that endpoint electrical data can be obtained between any two or more of the six clamps in FIG. 2 to derive a two-dimensional plating uniformity map representative of the thickness of copper formed at various points or paths along the wafer 20 over time. It is clear that the more clamps that are used at different positions, the more resolution the uniformity map can produce. FIGS. 1–2 illustrate one type of electroplating system, whereby many different structures or elements may be added to or deleted from the system of FIGS. 1–2 while still allowing FIGS. 1–2 to be adequately used in conjunction with the teachings of FIGS. 3–13 herein.

Generally, the system shown via FIGS. 1–2 may be used to electroplate copper or another metallic material over time onto the wafer 20 as is shown in FIGS. 3–7. Such copper or metallic plating can be accomplished by powering the cathode of FIG. 1 (and/or even the anode 14 of FIG. 1) using one or more of the techniques discussed herein with respect to FIGS. 8–13. A specific method that may be used to form improved copper single inlaid and/or dual inlaid interconnects over a semiconductor wafer may be further understood with detailed reference to FIGS. 3–13 hereinbelow.

Figure 3:
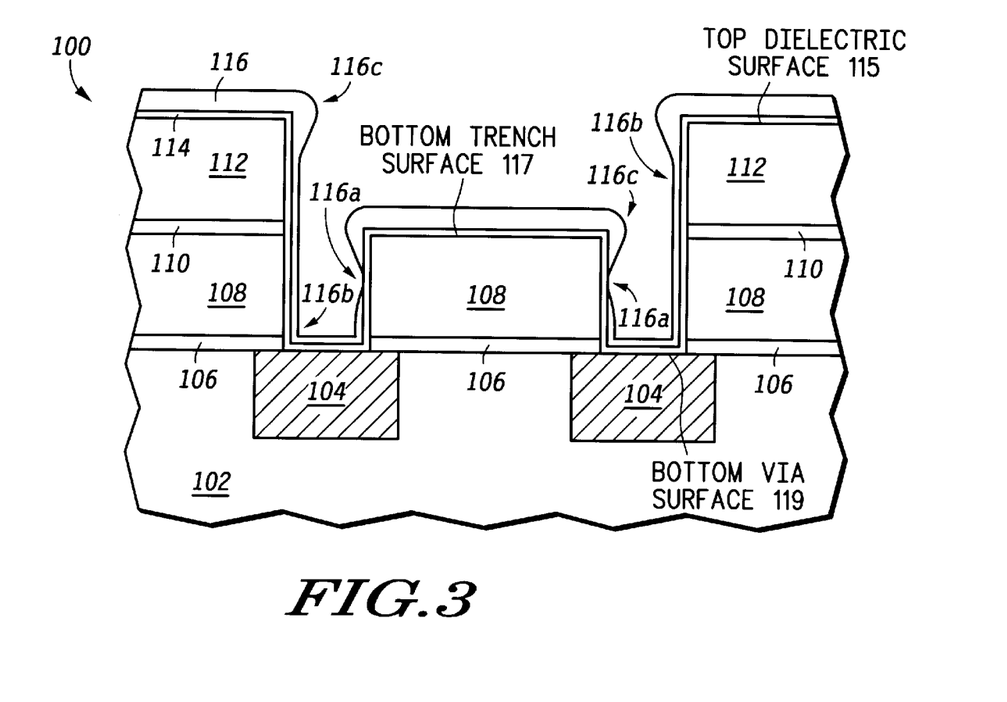
FIGS. 3–7 illustrate, in cross-sectional diagrams, a method for incrementally electroplating copper within a dual-inlaid structure using the system of FIGS. 1–2.

FIGS. 3–7 illustrate, in cross-sectional diagrams, a dual inlaid integrated circuit (IC) structure that is formed by copper electroplating material over time. Such electroplating is accomplished by using the apparatus illustrated in FIGS. 1 and 2 or an apparatus similar thereto. FIG. 3 illustrates a semiconductor structure 100 (e.g., which is simply one structure of many that is formed over a larger wafer 20). The semiconductor structure 100 contains one or more base layers 102. The base layers 102 will typically include a substrate which is preferably a semiconductor wafer. The substrate material provided as a bottom or base portion of the layer 102 of FIG. 3 is generally one or more silicon, germanium silicon, gallium arsenide, germanium, other III-V compounds, silicon carbide, silicon on insulator (SOI) materials, or like substrate materials.

Over this substrate material is formed the region 102 of FIG. 3. Region 102 typically includes a mixture of conductive, semiconductive, and/or dielectric layers that are photolithographically patterned and selectively etched to form semiconductor devices over and/or within the substrate material. For example, the region 102 may include one or more of various oxide and/or nitride layers such as silicon nitride, silicon dioxide, tetraethylorthosilicate (TEOS) glass, borophosphosilicate glass (BPSG), spin on glasses (SOGs), low k material, Xerogel, and/or the like. The region 102 may also contain semiconductive layers such as germanium silicon, polysilicon, amorphous silicon, doped polysilicon, and like materials. In addition to these potential layers, the multi-layer region 102 may also include conductive or metallic layers such as refractory silicides, refractory metals, aluminum, copper, tungsten, alloys of these materials, conductive nitrides, conductive oxides, or like metallic structures.

Two such metallic interconnection structures 104 are illustrated in FIG. 3 as overlying the layer 102. In one form, the regions 104 are inlaid copper interconnects which form a conductive interconnect for the device 100, of FIG. 3. In other forms, the layer 104 may be one or more of aluminum and/or tungsten regions. Generally, the interconnects 104 are positioned to electrically interconnect various active and/or passive electrical components formed within or below the layers 102 of FIG. 3.

Overlying layers 102 and 104 is an etch stop layer 106. The etch stop layer is generally a silicon nitride layer, an oxynitride layer, or a silicon-rich silicon nitride layer. Over the etch stop layer 106 is an interlevel dielectric (ILD) portion 108 which is generally formed of one or more of tetraethylorthosilicate (TEOS) glass, fluorine doped TEOS (f-TEOS), ozone TEOS, phosphosilicate glass (PSG), borophosphosilicate glass (BPSG), low k dielectric materials, nitrides, spin on glasses (SOG), or composites thereof. Overlying layer 108 is a second etch stop layer 110 which also may function as an anti-reflective coating (ARC) and is generally made up of the same material discussed above for layer 106. In one form, the layers 106 and 110 are a composite of silicon oxynitride, silicon nitride, silicon rich silicon nitride, and/or a similar dielectric material. Overlying the layer 110 is another ILD layer 112 which is similar to the layer 108 discussed above.

FIG. 3 illustrates that the layers 106 through 112 are lithographically patterned and etched by one or more lithographic patterning and etch processes to form an inlaid or dual inlaid structure. FIG. 3 specifically illustrates a dual inlaid structure having at least two vias formed through the layer 108 and one or more trench regions formed through the layer 112, where the trench region in layer 112 connects between the two vias in the layer 108 of FIG. 3. The dual inlaid trench structure of FIG. 3 has a bottom trench surface 117, a top dielectric surface 115 which is a top surface of the dielectric layer 112, and a bottom via surface 119 which is an exposed top surface of the metal interconnect regions 104.

FIG. 3 illustrates that a barrier layer 114 is formed within the dual inlaid trench structure and over the top dielectric surface 115. Generally, the layer 115 is a layer having a thickness less than 1000 Angstroms, and is generally made of any material which can prevent copper from adversely diffusing into the adjacent dielectric regions 112 and 108. Specifically, materials that have been used as copper barrier layers include, but are not limited to, tantalum nitride (TaN), titanium nitride (TiN), titanium tungsten (Ti/W), composites thereof, and/or like materials. In some cases, the dielectric materials 108 and 112 may be selected or surface processed wherein a barrier layer is not needed at all or whereby a surface portion of the layers 108 and 112 themselves function as a barrier.

FIG. 3 illustrates that a copper, metallic, or copper-alloy seed layer 116 is formed over a top of the optional barrier layer 114. In one form, the layer 116 may be a copper layer formed by sputtering or physical vapor deposition (PVD). In another form, the layer 116 may be formed using chemical vapor deposition (CVD). In some cases, a combination of a PVD process and CVD process may be used. In any case, the layer 116 is generally a layer that comprises copper and typically has a thickness of less than 2500 angstroms. Note that other techniques, such as electroless plating, may be used to form the seed layer 116 in FIG. 3

As is illustrated in FIG. 3, a popular PVD process is likely to form a seed layer 116 that is not completely uniform or conformal over all exposed surfaces and corners of the dual inlaid interconnect structure. Experimentation has shown that a PVD seed layer 116 will typically contain seed depletion areas 116a as illustrated in FIG. 3. The seed depletion areas 116a are regions of the exposed interconnect surface that contain little or no seed material whatsoever. If the region 116a does contain seed material, it is typically discontinuous nodules or islands of copper that are at least partially segmented from one another. Experience has shown that the seed depletion areas 116a are most likely to occur on a sidewall located between the bottom trench surface 117 and the bottom via surface 119, as shown in FIG. 3.

FIG. 3 also illustrates thinner seed portions 116b. The thinner seed regions 116b are generally regions of the seed layer that are continuous films (not islands or nodules as is region 116a) but thinner than most other portions of the seed layer over top dielectric surface 115. The regions 116b generally occur on sidewall portions of the trench structure between the dielectric top surface 115 and the via bottom surface 119 and/or on sidewall surface portions between the trench bottom surface 117 and the via bottom surface 119. In addition, it has been found that the seed layer portion that covers the bottom via surface 119 is typically thinner than the thickness of the seed layer formed over top dielectric surface 115. FIG. 3 also illustrates that thicker seed portions and thick corner portions 116c can be formed within the PVD seed layer 116.

Generally, the formation of regions 116a, 116b, and 116c can complicate subsequent electroplating operations as will be shown herein via FIGS. 4–7. It has been found that different methods for biasing the cathode of an electroplating system may prevent the various adverse consequences that may result from the presence of these regions 116a, 116b, and 116c of FIG. 3. The specific current, voltage, and/or power waveforms that have been shown to reduce the plating disadvantages resulting from the regions 116a, 116b, and 116c are specifically illustrated and discussed subsequently with respect to FIGS. 8–13.

After formation of the structure 100 illustrated in FIG. 3, the wafer 20 (which contains structure 100) is placed into the system 10 shown in FIGS. 1 and 2. This wafer 20 is then exposed to the electroplating solution 19 as shown in FIG. 1. During exposure to the solution 19, the control system 34 (through one or more of the clamps 18) is controlling the amount of power, current, or voltage supplied to the wafer 20 as shown in one or more of FIGS. 8–13 or any combination thereof to improve the quality of the electroplated copper film formed incrementally over the wafer 20 through FIGS. 4–7 herein.

Figure 4:
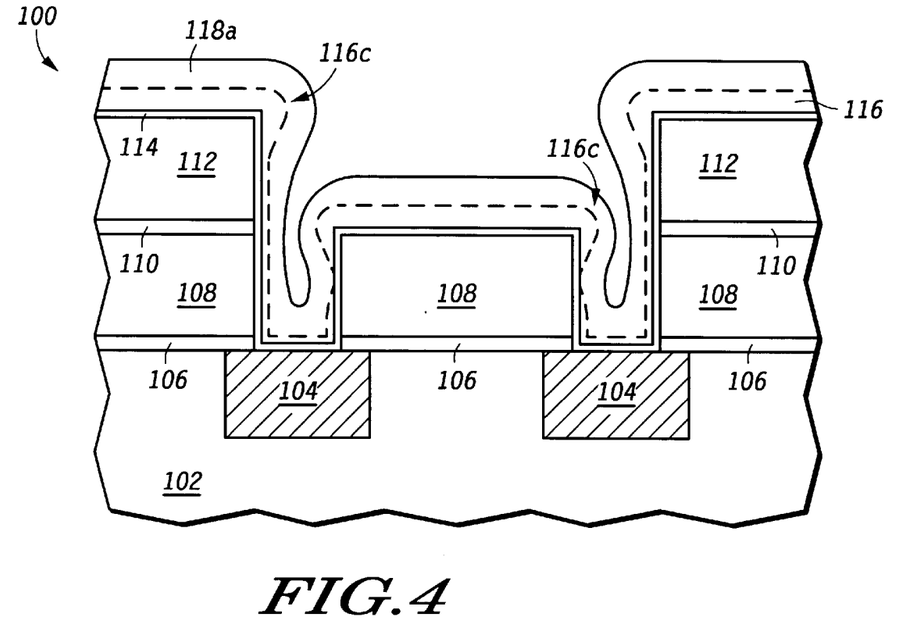

Specifically, FIG. 4 illustrates the beginning phases of a copper electroplating operation performed across the surfaces of the dual inlaid trench structure illustrated in FIG. 3. In FIG. 4, a high-powered electroplating process has been used to electroplate an incremental copper (Cu) layer 118a onto the wafer 20. The high-powered electroplating process that obtains the results of FIG. 4 provides a relatively high level of power to the cathode (wafer 20) within the system 10 of FIGS. 1–2 for an initial period of time during electroplating. The high-powered electroplating process will result in a high rate of copper deposition onto a surface of the seed layer 116 shown in FIG. 3. In addition to high deposition rates, the high-powered deposition process will facilitate plating onto the seed depletion areas 116a (see FIG. 3) that are void of seed layer or substantially reduced in seed layer content. It has been shown experimentally that low-powered electroplating process do not adequately plate these seed depletion areas 116a of FIG. 3 (i.e., low-power plating does not plate onto these regions at an acceptable rate) whereby voids are formed in the copper interconnect. Therefore, high power initial plating periods are used herein to improve copper interconnect quality in the presence of seed depletion areas 116a of FIG. 3, as well as to improve throughput via higher rates of initial Cu deposition. Note that the seed layer 116 and the newly electroplated copper layer 118a are separated by a dashed line indicating that the junction between the seed layer and the overlying electroplating layer may, at times, be impossible to identify in a scanning electron microscope (SEM) cross section, especially if the seed layer 116 is copper and the electroplated layer 118a is also copper.

In spite of the above advantages of high-powered electroplating periods, high-powered plating periods generally do not incorporate enough impurities, such as nitrogen, carbon, and sulfur, into the Cu film to improve or provide an adequate level of resistance to electromigration (EM). Therefore, the region 118a of FIG. 4 is most likely not as resistive to EM as is desired. In addition, as illustrated in FIG. 4, if a high-powered plating period is maintained for too long, the presence of the thicker regions 116c of FIG. 3 will eventually result in pinch off or voiding within the copper interconnect structure. In other words, high-powered electroplating has been shown to plate so quickly on surfaces 116c that the two adjacent regions 116c in FIG. 3 plate together before the vias are filled whereby pinch-off occurs. Pinch-off creates air gaps or voids in the interconnect structure near the via regions. Therefore, it was determined that electroplating of copper through the use of high-powered cycles, while tended to improve throughput and compensate for the presence of seed depletion areas 116a, suffered from the pinch-off and voiding and reduced EM resistance if such a high power process was maintained for too long of an initial period.

Since the higher-powered electroplating process experienced problems, low-powered electroplating was investigated to determine if it could solve the above problems. It has been experimentally found that low power electroplating processes that were initially used during electroplating processing (referred to as an initiation step) have not been able to adequately plate on the seed depleted areas 116a of FIG. 3, but do improve impurity incorporation (e.g., sulfur, nitrogen, carbon, etc.) into the copper film whereby resistance to electromigration (EM) in the final copper film is improved. Therefore, low-powered initial processing may be advantageous if the presence of depletion regions 116a can be wholly avoided in the seed formation. Such regions 116a may be wholly avoided if the seed layer 116 is not a PVD layer, but rather a CVD seed layer. Therefore, low power electroplating initialization operations are advantageous in some cases, especially when CVD seed layers are used that have a much reduced occurrence of depletion regions 116a in FIG. 3.

In some circumstances, in contrast to the above benefits of low-powered electroplating, low power periods within the initial stages of electroplating do not provide adequate wafer throughput through the system of FIG. 1. In addition, even though the deposition rate of a low power process is lower than a high-powered process, the deposition uniformity is unimproved over that illustrated in FIG. 4 over regions 116c. Therefore, both the low-powered and high-powered electroplating processing steps can eventually result in pinch-off and voids within the inlaid via region due to there presence of the regions 116c in FIG. 3. Therefore, it was found that an electroplating process that alternated low power and high power electroplating processes during deposition retained the high-powered benefits of overcoming depletion regions 116a and improving throughput, as well as incorporating the low-powered benefit of improved resistance to EM characteristic. However, the interconnects formed by a combined low-power/high-power electroplating processes still potentially result in pinch-off. It was therefore recognized that while an improved copper interconnect structure can be formed by combining various cycles of high power with various cycles of lower power whereby throughput, seed depletion area void resistance, and electromigration (EM) resistance can be balanced or optimized over time, voiding was still problematic. Therefore, it was recognized that further modifications to the plating process were needed to resolve the voiding problems resulting from pinch off even after adopting a high-power/low-power mixed plating cycle.

Figure 5:
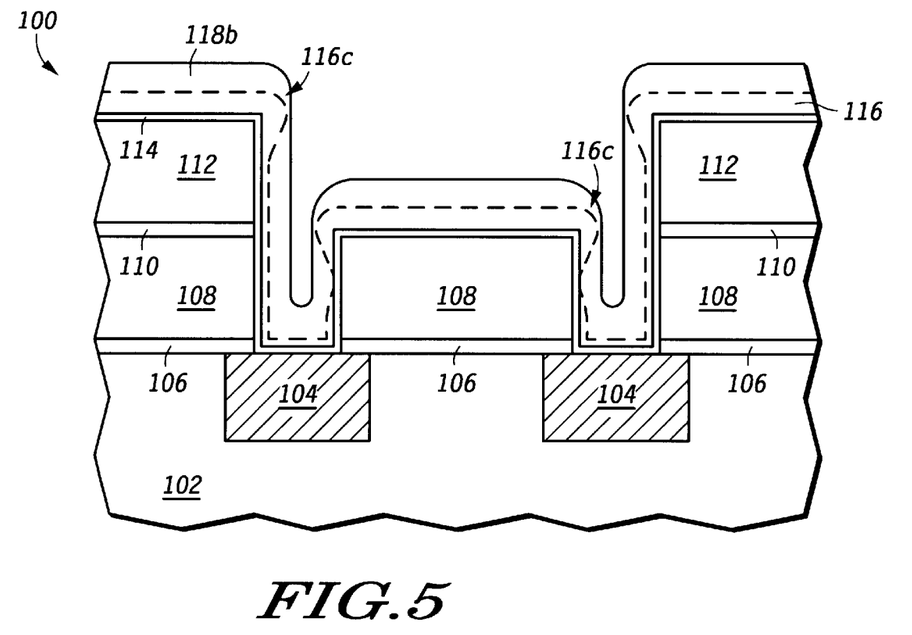

FIG. 4 illustrates that, even though an alternating high and low positive power cycles are used to form to initiate electroplating, voids are still likely to occur over regions 116c. To eliminate or reduce such voiding, it was found that negatively pulsed power (via either alternating current (AC), pulsed DC, or direct current (DC)) should be applied, one or more times, to the wafer 20, in FIG. 1 at various intervals between positive high and low power cycles discussed above. By periodically or occasionally applying some sort of negative power cycle to the wafer 20, it was found that pinch-off "danger" portions of layer 118a, shown in FIG. 4, can be effectively removed from the structure. Such negative power cycle correction of the regions 116c is shown by the resulting layer 118b in FIG. 5. Generally, by applying a negative power to the cathode of the system 10 of FIG. 1, the electroplating process is reversed and electroplated material previously deposited on the wafer is removed or sputtered from the wafer. During this negative power removal step, electroplated material is removed from the wafer 20 at higher rate from the thicker (higher current density) regions of layer 118a (e.g., areas 116c) than from the thinner (lower current density regions) formed via plating on regions 116a and/or 116b. The overall result is an incremental layer 118b formed on the seed 116 that is more conformal as illustrated in FIG. 5. Therefore, a negative power cycle used in conjunction with high-powered positive power and/or low-powered positive power cycles from FIG. 4 can greatly minimize the potential for producing voids in an interconnect opening by taking advantage of the reverse plating characteristics that compensate for the presence of the thicker regions 116c. In other words, negative power, supplied at specific intervals during the deposition of copper, has been shown to alter electroplating uniformity characteristics and can potentially reduce voiding in an interconnect opening if performed in proper sequence (see FIGS. 8–13 for various proper sequences).

Figure 6:
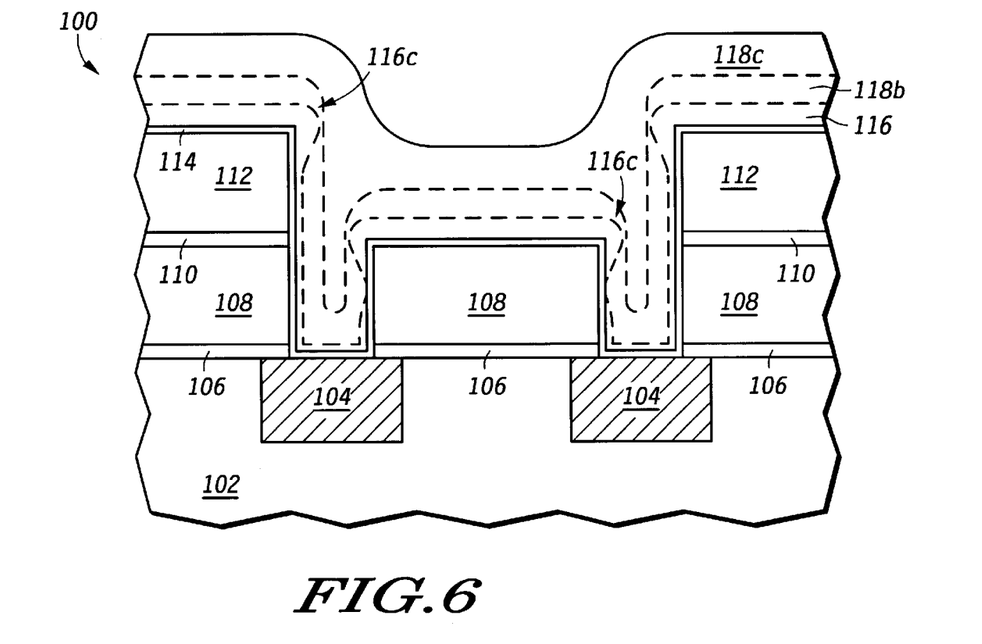

FIG. 6 illustrates that alternating high-powered AC and/or DC positive cycles, with low powered AC and/or DC positive cycles, and/or with occasional corrective negative AC and/or DC cycles will eventually electroplate and fill the interconnect structure of FIG. 3 in an optimal manner. Such optimal fill is therefore illustrated by copper layer 118c of FIG. 6. The specific engineering of various positive-high, positive-low, and negative power cycles and polarities during copper deposition has therefore been found to optimize interconnect quality will be discussed in more specific detail in FIGS. 8–13 herein. Generally, the methods taught herein for powering the system 10 will plate an interconnect from the seed 116 that has one or more of the various regions 116a, 116b, and 116c with improved yield and quality. Therefore, by controlling and alternating the potential, power, or current magnitude as well as polarity (i.e., negative or positive) to the cathode of system 10 of FIG. 1 over time, the entire plated layer 118 of FIG. 7 can be formed with improved resistance to electromigration (EM), enhanced uniformity, reduced or eliminated pinch-off, improved wafer throughput, and an absence of voids.

Figure 7:
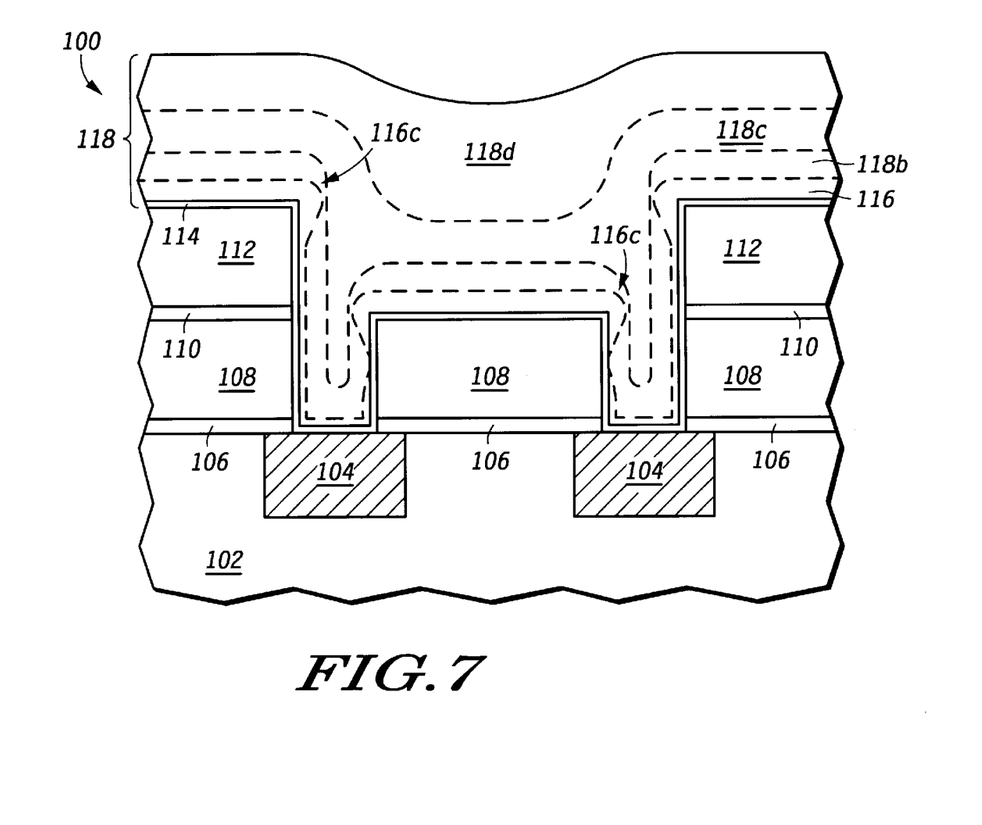

FIG. 7 illustrates that, at some point during the electroplating process, the copper 118c completely fills the interconnect opening. After the point when no voiding risk remains, a rapid, high powered, DC electroplating cycle can commence whereby throughput is improved. Therefore, the copper material 118d deposited in FIG. 7 over existing copper material 118c is deposited at a rapid rate using a high-powered, positive, DC electroplating process or other high throughput waveforms. The result is a copper film that completely fills the interconnect opening and has been optimized and improved for high volume and high yield use within the integrated circuit (IC) industry. In addition, it is possible to use, as one or more process cycles herein, a bottom-up fill process which deposits at a higher rate within the vias and at a low or nonexistent rate on the top dielectric surface 115. Such a bottom-up fill cycle could also aid in the manufacture of an improved copper interconnect as taught herein.

FIGS. 3–7 illustrate that a copper interconnect can be formed on a semiconductor wafer with improved electromigration (EM) resistance, adequate wafer throughput, and significantly reduced voiding and pinch-off by controlling the type, magnitude and polarity of the power applied to the cathode and/or anode of the chamber 10, in FIG. 1, during electroplating.

FIGS. 8–13 illustrate specific power sequences which may be applied to the cathode of FIG. 1, via the control system 34, in order to obtain one or more of the various improved results discussed previously with respect to FIGS. 3–7.

Figure 8:
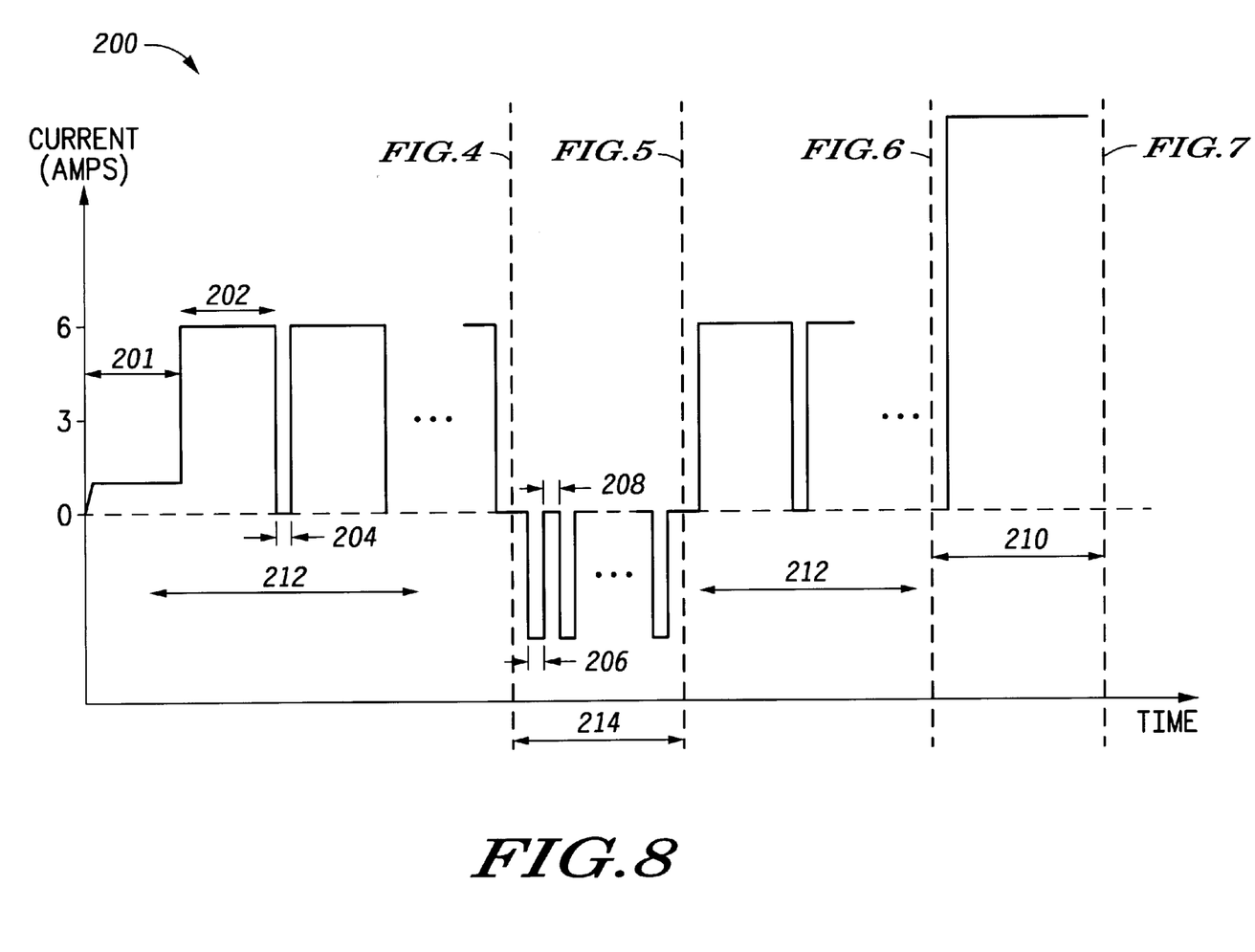
FIGS. 8–13 illustrate, in various XY time lines, several different methods by which the cathode assembly of the electroplating chamber of FIG. 1 may be controlled during copper electroplating in order to improve the quality of copper interconnects over that taught by the prior art.

Specifically, FIG. 8 illustrates one possible sequence by which the cathode (i.e., wafer 20) of FIG. 1 may be electrically controlled to result in formation of the improved copper interconnect discussed with respect to FIGS. 3–7 above. FIG. 8 is an XY plot, wherein the vertical Y axis indicates current (I) in amperes and the horizontal X axis indicates time in seconds. While FIG. 8 indicates current on a vertical axis, it is important to note that any of current, current density, voltage, or power may be illustrated as the Y axis in FIGS. 8–13, without departing from the spirit and scope of the invention. In other words, current, current density, voltage, or power are generally interchangeable quantities or terms when used herein.

FIG. 8 illustrates a cathode power sequence which is best utilized with a chemical vapor deposition (CVD) seed layer 116 which does not have the seed depletion areas 116a as shown in FIG. 3. It has been experimentally shown that CVD deposited seed layers are less likely to result in seed depletion areas 116a as compared to seed layers formed using physical vapor deposition (PVD) or sputtering processes. Since these depletion areas 116a are likely not to be present, a low voltage positive DC initialization step/cycle 201 may be used as illustrated to the left of FIG. 8. The low voltage initiation phase 201 is advantageous for CVD seeds since it will incorporate a greater quantity of impurities into the electroplated copper film, whereby electromigration (EM) resistance is improved.

Generally, for a typical electroplating process, the initialization step 201 uses a positive DC current between approximately 0.5 amps and 3 amps. FIG. 8 specifically illustrates that the current is set to 1 amp during the time period of step 201. Generally, this initialization step 201 can last anywhere from several seconds to approximately one minute in duration.

After completion of the initialization step 201 wherein some copper material is deposited on the wafer 20, a positively pulsed-power step 212 is initiated. FIG. 8 illustrates that alternating periods of positive on current 202 and off current 204 are provided by the controller 34 of FIG. 1, to the wafer 20, in the period 212. The period 212 may contain one or more on or off pulses and will generally last in duration anywhere from approximately 1 millisecond (ms) to 1 second. In a preferred embodiment, the on time period 202 of the positive pulse 202 in time period 212 is approximately 7.5 milliseconds in duration while the off time period 204 in period 212 is approximately 0.5 milliseconds in duration. It is important to note that other time durations or other duty cycles may be used for the on pulse(s) 202 and the off pulse(s) 204 in FIG. 8. FIG. 8 illustrates that the current or power level provided during the on period 202 of cycle 212 is approximately 6 amps. Generally, the power level during the on periods 202 of period 212 should be higher than the power level during period 201. This higher power allows the additives, within the solution 19 of FIG. 1, to be adequately activated during plating. However, the power level during the on period 202 should not be so great that the advantageous functions provided by the additives are inhibited. For this reasons, the power levels of FIG. 8, in period 212, may vary according to the composition of the solution 19 and the type of electroplating system that is used.

After initialization step 201 and positive pulsed-power step 212, the wafer 20 will appear similar to that shown in FIG. 4 as indicated on FIG. 8. Therefore, the copper or copper alloy material deposited thus far will have generally been deposited at a high overall deposition rate but most likely has been deposited such that the composite seed and overlying electroplated layer are nonconformally deposited within the interconnect opening. As previously discussed continuation of this nonconformal positive power deposition makes the copper interconnect much more prone to voiding problems associated with pinch-off. In addition, the lower power initialization step 201 will have difficulty plating over the depletion areas 116a, if they exist (which is highly likely for a PVD seed layer). If the regions 116a do exist, the period 212 may alternatively be used initially to plate over the areas 116a instead of using the cycle 201. However, because the incorporation of impurities is generally improved using lower power processes, resistance to electromigration (EM) is correspondingly improve using the initialization step 201 when feasible.

To minimize the voiding consistent with long term exposure to periods 201 and/or 212, the positive pulsing time period 212 is eventually terminated and a negative pulsing time period 214 is initiated (see middle of FIG. 8). The total time duration of the negative pulsing time period 214 is generally anywhere from approximately 0.2 milliseconds to 1 second. In FIG. 8, the negative pulsing time period 214 deplates, or removes, copper from the wafer surface. Copper is removed at a higher rate from high current density (thicker) areas of the copper layer on the wafer. This removal of copper evens out the sidewall profile of the composite seed and plated copper film, reducing the "pinch off" risk illustrated in FIG. 4 and producing the more uniform electroplating copper film profile illustrated and discussed previously with respect to FIG. 5.

In order for an overall positive thickness of copper to form over a period of time on the wafer 20, the amount of copper deposited during period 212 should generally be greater than the amount of copper material removed during the period 214. Therefore, the period 212 should either be of longer time duration than period 214 and/or period 212 should provide a greater average absolute value power to the wafer than the absolute value of the power provided in period 214. For period 214, the total on time 206 of period 214 is approximately 0.5 milliseconds while the off time period 208 is approximately 0.5 milliseconds. However, any duty cycle or time duration of pulses can be used in period 214 provided that the overall amount of copper deposited exceeds the amount of copper removed over time.

In addition, FIG. 8 illustrates that the magnitude of the negative pulses during the on time period 206 is approximately negative 4 amps and may be as large as the power supply allows provided the deposited copper exceeds the amount of copper removed during this period. Generally, any magnitude of negatively pulsed current may be used so long it is capable of removing copper and producing the profile generally illustrated in FIG. 5. Therefore, other duty cycles, other frequencies of switching, either synchronous or asynchronous on/off pulses, other pulses of varying time duration and power levels, etc., may be used during the pulsed time periods taught herein in FIGS. 8–13.

After negatively pulsed time period 214 is complete, an interconnect opening appearing similar to that illustrated in FIG. 5 is present within the system of FIG. 1. After at least one positively pulsed time period 212, and one negatively pulsed time period 214, the control system 34 of FIG. 1 may continue to alternate between the cycles 212 and 214 for any number of given times and in any number of synchronous or asynchronous orders. Therefore, any combination, order, and/or number of the positively and negatively pulsed cycles 212 and 214 may be used to fill the interconnect opening taught herein. Generally, enough positively and negatively pulsed cycles 212 and 214 are performed to ensure that the structure of FIG. 6 is adequately formed in a void free manner to some target thickness as previously discussed.

After the interconnect opening of FIG. 6 is adequately filled using any combination of periods 201, 212, and 214 in FIG. 8, it may be desirable, for throughput considerations, to power wafer 20 at a high DC potential, as illustrated by time period 210 at a right side of FIG. 8. By using a high-power DC potential during time period 210 the uppermost portions of the copper layer (e.g., region 118d of FIG. 7) may be deposited at a high rate without risks of voiding whereby throughput is improved.

After the period 210 of FIG. 8 is complete, the wafer 20 may be removed from the system of FIG. 1 and moved to a chemical mechanical polishing (CMP) operation to finish formation of a dual inlaid interconnect structure having reduced or eliminated voiding, improved reliability, and/or enhanced performance. The process of FIG. 8, as well as other processes taught herein, may currently be performed sequentially on multiple distinct and stacked layers of metallurgy over a substrate of an integrated circuit (IC) (e.g., seven or more layers of copper interconnects over an IC are possible using current technology).

Figure 9:
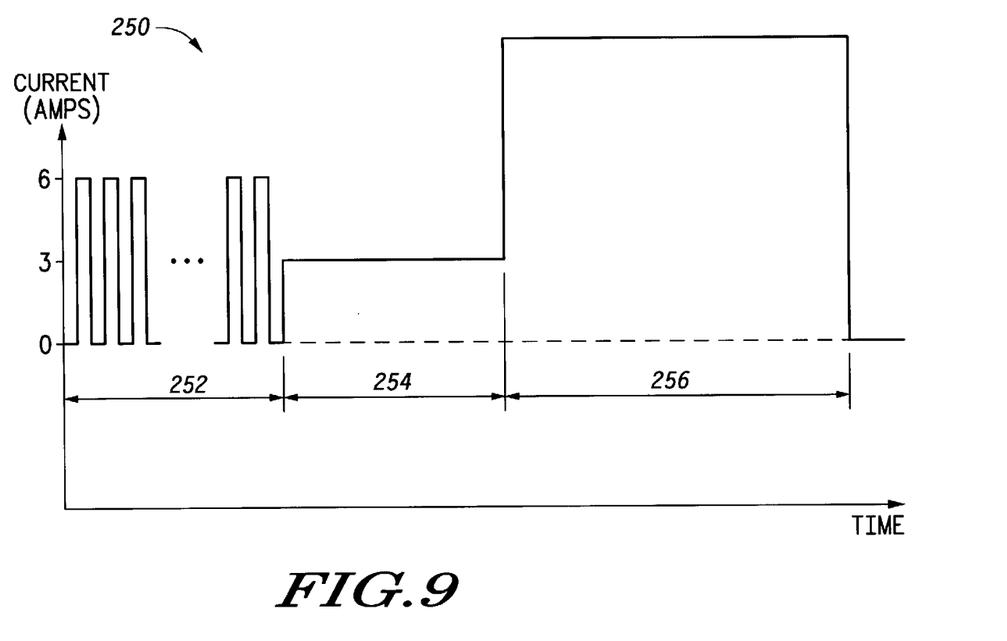

In the process of FIG. 8, it was discovered that the initiation period 201, which is a low-powered, DC, long-time-duration period, was not always adequate to plate over the seed depletion areas 116a which are likely to be present when using PVD processes to form the seed layer 116. If the regions 116a of the seed layer 116 are not properly electroplated, unwanted sidewall voids may form in the via portions of the interconnect structure of FIGS. 3–7. Therefore, since regions 116a are likely to occur in PVD deposited seed layers, the power sequence of FIG. 9 is usually more suitable than FIG. 8 when used in conjunction with PVD seed layers 116. However, the either process of FIG. 8 or FIG. 9 may be used with any seed layer 116 formed in any manner.

FIG. 9 illustrates the use of an initialization step 252 that uses high-powered, positive-pulsed cycles prior to using increasing DC current cycles 254 and 256 to deposit the copper layer. It was found that an initial period 252 of high-powered, positive-pulsed cycles can effectively be used to electroplate over seed depletion areas 116a of FIG. 3. This period 252 serves as a nucleation step for copper growth onto the depleted seed areas 116a and 116b as shown in FIG. 3. After a time period of several milliseconds to several seconds, optional negative pulsed periods 214, as previously illustrated in FIG. 8, can then be intermittently used to reduce the likelihood of void formation within the positive-pulsed period 252. After the positive pulsed processing has occurred via step 252 (including any optional negative pulsing mixed therewith), a low power positive DC current is applied to the wafer 20 for a time period 254 which serves as a film growth step and acts similarly to the initialization step 201 in FIG. 8.

It was found that low power electroplating time periods, such as period 254 in FIG. 9, incorporate increased quantities of impurities (e.g., sulfur, carbon, and nitrogen) into the copper film whereby resistance to electromigration (EM) is improved. Even though low power positive DC processes have been shown to be inadequate for plating on seed depletion areas 116a and have been shown to produce voiding in some cases, using one or more periods of low power positive DC processing time periods 254 to plate on top of the structure of FIG. 5 (which is formed by one or more positive, pulsed-power control sequences) is advantageous since it generally improves electromigration resistance. Voids and depletion areas will not adversely occur during the period 254 since such risk of voids and copper depletion areas have been previously overcome via the pulsed timed sequences 252.

However, while electroplating during time period 254 may improve electromigration (EM) resistance, electroplating during time period 254 plates copper onto the surface of the wafer 20 at a very slow rate. Therefore, to improve throughput, the process of FIG. 9 is eventual progressed to a high powered positive DC processing step, indicated by time period 256 in FIG. 9, whereby wafer throughput can be compensated for while still taking advantage of the electromigration benefits resulting from time period 254. In addition, these impurities may be ion implanted into the copper film after deposition and thermally annealed if greater impurity concentration is needed after electroplating.

Therefore, the process illustrated in FIG. 9, whereby the control system 35 of FIG. 1 controls the cathode and/or anode of FIG. 1, results in an improved dual inlaid copper interconnect structure on a semiconductor wafer, similar to that illustrated in FIG. 7. Once again, it is important to note that the specific currents, voltages, time periods, and duty cycles on/off pulse widths and uniformity, etc., illustrated in FIG. 9, may be adjusted to accommodate varying plating bath compositions and equipment, and/or to produce varying processing results.

Figure 10:
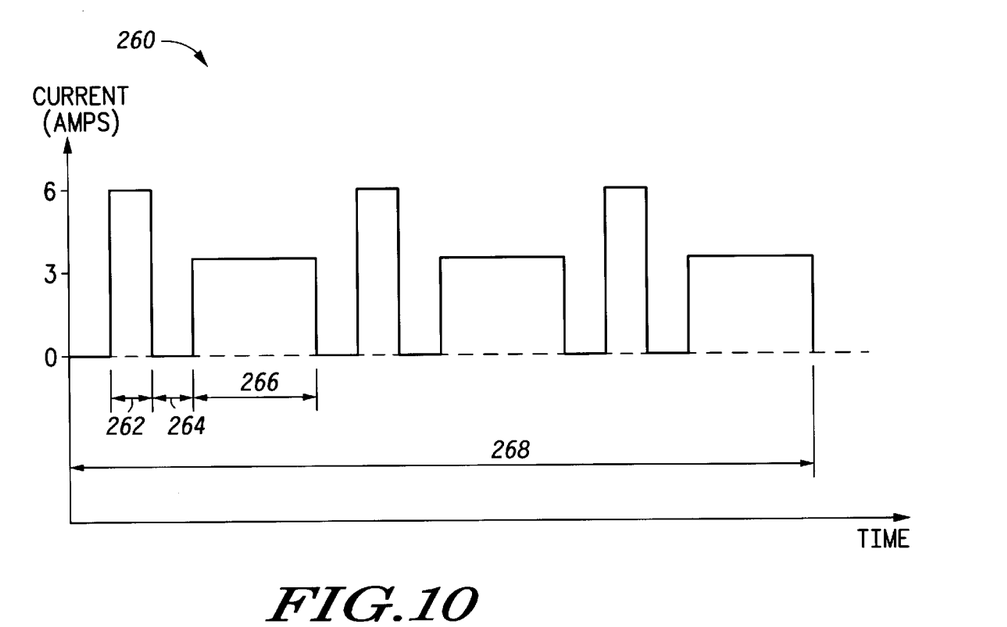

FIG. 10 illustrates a pulsed time sequence 268 which may be used to replace any of the pulsed time sequences 252, 212, 214, etc., previously illustrated with respect to FIGS. 8–9. In addition, the time sequence 268 may be used in conjunction with any other type of DC and/or AC, positive and/or negative power time sequence used for electroplating herein. FIG. 10 illustrates that the sequence 268 comprises on pulses of varying time duration and/or varying current magnitudes. As previously discussed, high powered pulses and low powered pulses vary in their ability to adequately plate material, or affect nucleation and subsequent lateral film growth over regions 116a, 116b, and 116c in FIG. 3, and they have varying effects on throughput, electromigration (EM) resistance, void reduction, grain structure, and the like. Therefore, it was discovered that the combination of shorter high-powered on pulses 262 and longer low-powered on pulses 266 separated by off periods 264 is advantageous in some applications. The power sequence illustrated in FIG. 10 may be combined with negative pulse sequences, DC sequences, AC sequences, pulsed DC sequences, or any other possible sequences in order to plate copper within a dual inlaid interconnect opening in an improved manner. Once again, as with the other figures taught herein, the specific duty cycles, current ranges, timed durations, and the like may vary from machine-to-machine or from process-to-process without departing from the spirit and scope herein.

Figure 11:
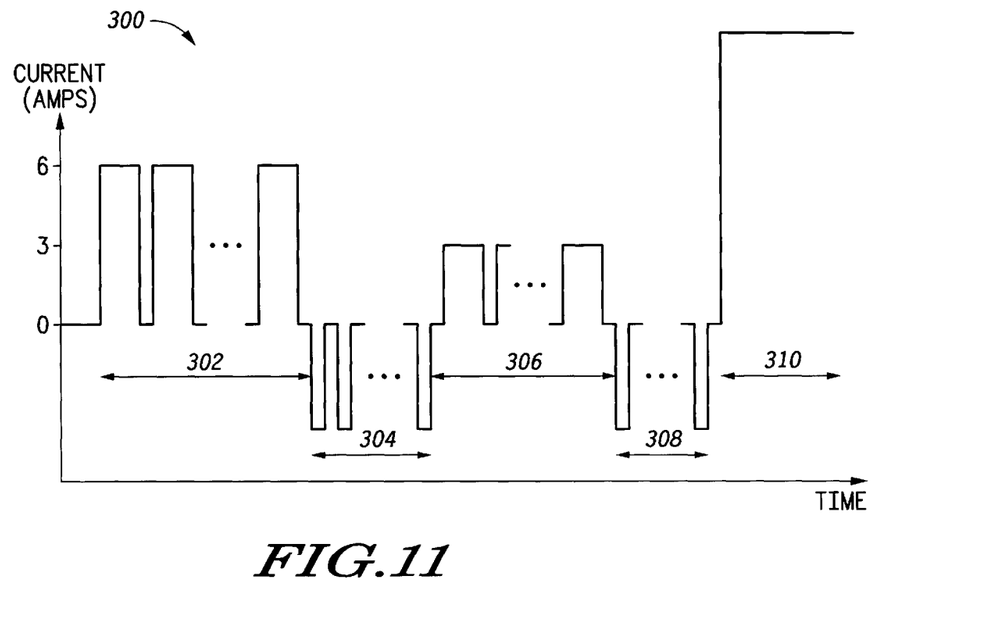

FIG. 11 illustrates yet another power sequence that can be used with the system 10, of FIG. 1. FIG. 11 illustrates that a high-powered, positive, pulsed time period 302 may be used to effectively plate initially over the seed depletion areas 116a at a high deposition rate. After one or more periods 302, optionally intersperse between negative pulse periods similar to period 304 illustrated in FIG. 11, lower power positive pulsed periods 306 are used to continue plating at a slower rate while incorporating improved quantities of impurities (such as carbon, nitrogen, and/or sulfur) into the copper material to improve electromigration (EM) resistance.

As indicated in FIG. 11 the high power positive pulsed periods 302 and the low power positive pulsed periods 306 can be separated by equivalent or different low powered pulsed sequence 304 or 308 as illustrated in FIG. 11. Generally, the negative power sequence 308 that follows the positive power sequence 306 is of shorter duration and/or of less overall integrated power than those periods 304 following the higher powered positive periods 302. This is because the periods 306 deposit less material on the surface of the wafer 20 than the periods 302, whereby it is clear that less material needs to be removed in subsequent negative-powered periods to obtain reduced voiding and/or improved uniformity. Also, periods 302 may have one or more forward pulses intermingled with negative pulses, and period 304 may be comprised of one or more reverse periods as well. In addition, FIG. 11 illustrates, as is also shown in FIG. 8, that a high power DC operation may commence near the end of electroplating operations in order to improve the wafer throughput of system 10. Therefore, the high-powered DC period 310, of FIG. 11, is used at the end of the electroplating operation (see FIG. 7).

Figure 12:
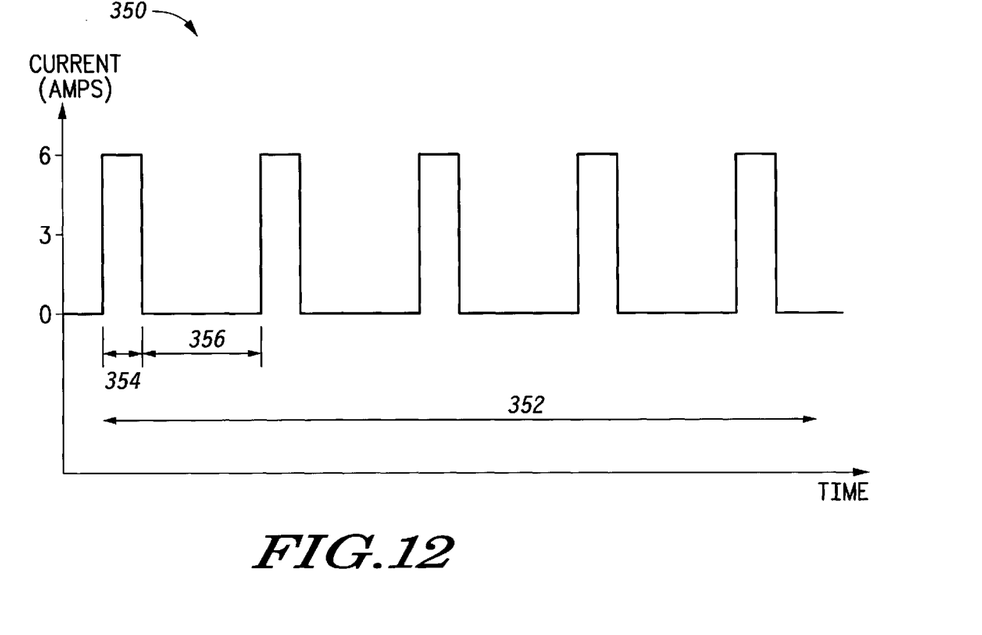

FIG. 12 illustrates another power period 352 which may be used for any of the periods illustrated previously in FIGS. 8–11. The off periods 356 in FIG. 12, and in fact all of the off periods illustrated in FIGS. 8–11, are provided to allow the solution 19 of FIG. 1 to recover after electroplating operations have occurred. In other words, the on pulses of various time periods will result in the copper, that is located in close proximity (the boundary layer) to the wafer 20 in the solution 19, being deposited upon the wafer. This creates regions within the solution 19, near the plated surface, which are devoid of plating materials and additives. In order to allow this devoid region (i.e., gradient in concentration in the bath 19) near the plating surface to be refreshed with copper, additives and other impurities, the off cycle is used to allow for the diffusion of the materials within the solution from areas of high concentration (bulk) to areas of low concentration (wafer surface or boundary layers). This is especially important when plating within high aspect ratio openings as will be discussed subsequently.

FIG. 12 illustrates that the duty cycle of a power sequence 352 may be such that the on period 354 is equal to or less than the off cycle 356. This type of duty cycle may be necessary in extremely small vias (e.g., less than 0.2 micron) or in vias of extremely large aspect ratios (like a trench capacitor with trench depth of 8 microns and a trench width of 0.5 microns). By virtue of the size and/or aspect ratio of the opening, it may take a longer time for the impurities, additives, or copper to diffuse through the solution to the regions where these materials have been depleted as a result of the plating process. In these cases, a longer relative off time 356 is provided to allow extremely small geometry's or large aspect ratio openings to adequately recover from depletion of these species without significantly impacting the quality of the copper film. It is anticipated that the process of FIG. 12 may be used in one or more applications where advanced lithography, such as X-ray lithography, phase shifting, SCALPAL, or E-beam lithography, is used in conjunction with forming copper interconnects or copper electrodes. It is believed that this "long off time" periodic cycle will be especially needed for 0.1 micron vias or sub 0.1 micron vias and/or any aspect ratio opening having a depth-to-width ratio of 6:1 or greater.

Figure 13:
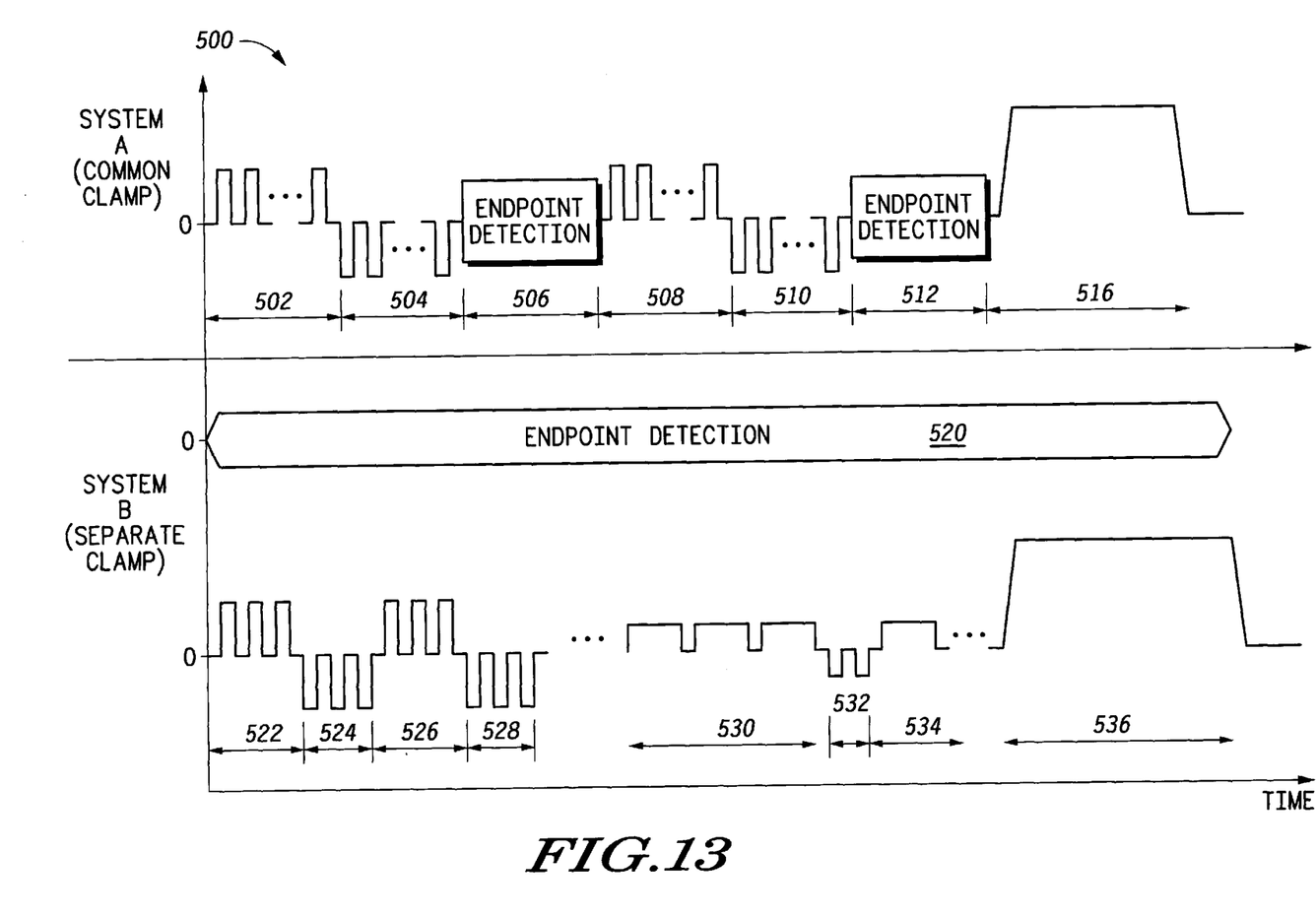

FIG. 13 illustrates the operation of two possible electroplating systems (system A and system B). Either system A or B (or another system formed in accordance with the concepts set forth in FIG. 13) may be used to electroplate copper or any other metallurgy onto any substrate with insitu endpoint detection or insitu process control. This endpointing methodology and system may be used in conjunction with any of the waveforms shown in FIGS. 8–12 and may be performed using the system 10 of FIG. 1.

Specifically, a top portion of FIG. 13 illustrates a system A. System A is similar to the system 10 shown in FIG. 1 whereby power is supplied to the wafer 20 through the same clamps 18 that are used for endpoint detection, data acquisition, and insitu control. In other words, one or more of the cycles 201, 212, 214, 210, 252, 254, 256, 268, etc., from FIGS. 8–12 or some portion of these sequences may be applied to a wafer 20 and then intermittently be interrupted whereby endpoint detection operations then commence on the same clamps 18. Therefore, system A, is referred to as a time multiplexed endpoint detection system whereby certain clamps 18 are used for both power during electroplating and endpoint/process insitu detection.

As one example of the operation of such a time multiplexed system, system A in FIG. 13 is illustrated as performing a positive pulsed power sequence 502 immediately followed by a negative pulsed power sequence 504. These power sequences are performed through one or more clamps 18 as illustrated in FIGS. 1 and 2. After performing one or more of these cycles 502 and 504, the power supplies 28 are disconnected from the clamps 18 via the switches 32 of FIG. 1. At this point, the endpoint sensors 30 are connected by the switches 32 to the clamps 18. This connection, which is enabled by the switches 32 under control of the CPU 26, allows an endpoint detection operation 506 to occur in FIG. 13.

In time period 506, voltage and/or current is provided and/or detected across one or more clamps to determine whether the resistance of the copper plating on the wafer 20 indicates that an adequate thickness of copper has been formed on the wafer 20. In addition, multi-directional, two-dimensional probing across many probe/contract points may occur across the surface of the wafer 20 in time period 506. Therefore, time period 506 may determine the uniformity or thickness of material between various points on the wafer and such data can be stored for database creation or may be plotted two-dimensionally in order to track uniformity issues on a wafer-to-wafer basis. Also, this uniformity data may be processed by the CPU 26 to subsequently alter power, provided by the power supply 28, to the wafer 20 on a clamp-by-clamp basis whereby uniformity can be improved in an insitu manner in the electroplating operation.

In addition, the endpointing of period 506 may not be attempting to detect when to cease electroplating operations, but may be used to detect when the electroplating operation should cease one course of action and commence with another course of action. For example, the endpoint detection of period 506 may be used to determine when iterative cycling of the two time periods 502 and 504 should be changed to the cycling of other time periods 508 and 510 that have different duty cycles or voltage/current levels. In addition, end point detection 512 may be used to determine when to switch from pulsed operation to DC operation 516 as illustrated in FIG. 13. In other words, the period 512 of FIG. 13 may be used to detect when the wafer 20 has arrived at the point illustrated in FIG. 6 and change the process to period 516 of FIG. 13 to rapidly deposit material to arrive at the structure shown in FIG. 7. Furthermore, endpoint detection can be used to determine when new additives are to be added to the solution 19 or when other conditions of the system 10 or solution 19 should be altered. As an example, more brighteners, inhibitors, or other additives may be increased in flow, reduced in flow, or totally eliminated from provision to the bath 19 based upon the data obtained in the windows 506 and 512. Of course, in its most useful fashion, end point detection windows such as 506 and 512 can be used at the end of any electroplating process to determine when electroplating operations should cease (e.g., at the end of the period 516).

FIG. 13 also illustrates a system B similar to that also illustrated in FIG. 1, yet different from that discussed above for system A. In system B of FIG. 13, some clamps 18 are permanently intended to be coupled under some sort of switched control of the power supplies 28, while other clamps 18 are intended to be coupled permanently under the control of the endpoint controller 30. When using this system B (which is referred to as a continuous monitoring system), pulsed operations 522–534 may be commenced and DC operations such as operation 536 of FIG. 13 may continue to operate in an uninterrupted manner through the clamps 18 connected to the power supplies 28. Parallel in time to the powering of the wafer 20 through these clamps 18 via the waveforms 522,524,526, 528, 530, 532, 534, and 536, other clamps 18 in FIG. 1 may be used to monitor uniformity, deposition rates, impurity levels, and/or endpoint parameters via the time period 520 illustrated in FIG. 13.

Therefore, endpoint detection for system 10 of FIG. 13 may be continuous as illustrated via time period 520 in FIG. 13, or may be performed on a time multiplexed or interrupt basis, such as that illustrated via end point periods 506 and 512 in FIG. 13, or both. It is important to note that the endpoint detection operations may be placed anywhere within any of the waveforms illustrated previously in FIGS. 8–12 or between any waveforms illustrated in FIGS. 8–12. Endpointing may also be automatically done with low current and low voltage detection during "off" cycles of various pulsed cycles. In addition, although not specifically shown in FIG. 13 or FIG. 1, the endpointing discussed herein may be done in a two chamber system under robotic control. Electroplating can occur in a first chamber similar to system 10. However, the system 10 will contain another chamber in close proximity the electroplating chamber whereby a robot can move the wafer back and forth between the electroplating chamber and the endpoint detection (a four point probe chamber, or like) until an endpoint condition is detected in the second chamber.

Although the present invention has been described with reference to a specific embodiment, further modifications and improvements will occur to those skilled in the art. It is to be understood therefore, that the invention encompasses all such modifications that do not depart from the spirit and scope of the invention as defined in the appended claims.

What is claimed is:

1. A method for forming a copper layer over a wafer, the method comprising the steps of:

placing the wafer in an electroplating chamber, the electroplating chamber having a control system wherein the control system is electrically coupled to the wafer through at least one electrical contact that provides power to the wafer;

providing a first power to the wafer at a first power level for a first time period; and positively pulsing a second power to the wafer during a second time period following the first time period, the second power having on time periods and off time periods, and wherein: (1) a second power level that is supplied to the wafer during the on time periods of the second time period is greater than the first power level used during the first time period; and (2) a third power level that is supplied to the wafer during the off time periods of the second time period is less than the first power level used during the first time period.

2. The method of claim 1, further comprising negatively pulsing a third power to the wafer during a third time period following the second time period.

3. The method of claim 2, further comprising positively pulsing a fourth power to the wafer during a fourth time period following the third time period.

4. The method of claim 3, further comprising providing a positive power having a DC constant level to the wafer during a fifth time period following the fourth time period.

5. The method of claim 4, wherein a magnitude of the positive power having a DC constant level is greater than a magnitude of the second power level used during the second time period.

6. The method of claim 1, wherein the copper layer is formed overlying a seed layer that has been formed using chemical vapor deposition (CVD).

7. The method of claim 1, wherein the copper layer forms portions of a dual inlaid interconnect structure.

8. The method of claim 1, wherein an insitu endpoint detection step is performed sometime during formation of the copper layer over the wafer.

9. A method for forming a copper layer over a wafer, the method comprising the steps of:

placing the wafer in an electroplating chamber, the electroplating chamber having a control system, wherein the control system is electrically coupled to the wafer through at least one electrical contact, and wherein the control system provides power to the wafer;

positively pulsing power to the wafer during a first time period, wherein positively pulsing power has on periods at a first power level and off periods at a second power level;

providing a first constant power to the wafer during a second time period following the first time period, wherein the first constant power has a third power level that is less than the first power level and greater than the second power level; and providing a second constant power to the wafer during a third time period following the second time period, wherein the second constant power has a fourth power level that is greater than the first power level.

10. The method of claim 9, wherein the copper layer is used to form a dual inlaid interconnect structure.

11. The method of claim 9, wherein an insitu endpoint detection step is performed sometime during formation of the copper layer over the wafer.

12. A method for forming a copper layer over a wafer, the method comprising the steps of:

placing the wafer in an electroplating chamber, the electroplating chamber having a control system, wherein the control system is electrically coupled to the wafer through at least one electrical contact, and wherein the control system provides power to the wafer; and pulsing power to the wafer, wherein the pulsing power comprises a first on time period and a second on time period, wherein a first power level applied during the first on time period is associated with a first positive current and a second power level applied during the second on time period is associated with a second positive current, and wherein the first positive current is greater than the second positive current.

13. The method of claim 12, wherein the second on time period is greater than the first on time period.

14. The method of claim 12, wherein a level of impurities incorporated into the copper layer is greater during the second on time period than during the first on time period.

15. The method of claim 14, wherein the impurities consist of an element selected from a group consisting of: sulfur, carbon and nitrogen.

16. The method of claim 12, wherein an insitu endpoint detection step is performed sometime during formation of the copper layer over the wafer.

17. A method for forming a copper layer over a wafer, the method comprising the steps of:

placing the wafer in an electroplating chamber, the electroplating chamber having a control system, wherein the control system is electrically coupled to the wafer through at least one electrical contact, and wherein the control system provides power to the wafer;

positively pulsing a first power to the wafer during a first time period, wherein positively pulsing the first power further comprises on time periods at a first power level and off periods at a second power level;

negatively pulsing a second power to the wafer during a second time period that follows the first time period, wherein negatively pulsing a second power further comprises on time periods at a third power level and off time periods at a fourth power level; and positively pulsing a third power to the wafer during a third time period that follows the second time period, wherein positively pulsing the third power further comprises on time periods at a fifth power level and off time periods at a sixth power level wherein the fifth power level is less than the first power level.

18. The method of claim 17, further comprising providing a constant positive power to the wafer during a fourth time period following the third time period.

19. The method of claim 17, wherein the on time periods at a first power level are greater than the off time periods at a second power level, and wherein the on time periods at a fifth power level are greater than the off time periods at a sixth power level.

20. The method of claim 17, wherein an insitu endpoint detection step is performed sometime during formation of the copper layer over the wafer.

21. A method for forming a copper layer over a wafer, the method comprising the steps of:

placing the wafer in an electroplating chamber, the electroplating chamber having a control system, wherein the control system is electrically coupled to the wafer through at least one electrical contact, and wherein the control system provides power to the wafer; and positively pulsing power to the wafer, wherein positively pulsing power comprises on time periods and off time periods, and wherein the on time periods are less than the off time periods.

22. The method of claim 21, wherein the copper layer fills portions of a dual inlaid structure having dimensions smaller than 0.1 microns.

23. The method of claim 21, wherein the copper layer fills portions of an opening having an aspect ratio of depth:width of greater than or equal to 6:1.

24. The method of claim 21, wherein an insitu endpoint detection step is performed sometime during formation of the copper layer over the wafer.

25. A method for forming a copper layer over a wafer, the method comprising the steps of:

placing the wafer in an electroplating chamber, wherein:
the wafer has a dual inlaid interconnect opening with a top dielectric surface, a bottom trench surface positioned at a planar surface below the top dielectric surface, and a bottom via surface positioned at a planar surface below the bottom trench surface, and the electroplating chamber has a control system that is electrically coupled to the wafer through at least one electrical contact, and wherein the control system provides power to the wafer;

positively pulsing power to the wafer for a first time period;

negatively pulsing power to the wafer for a second time period following the first time period; and positively pulsing power to the wafer for a third time period following the second time period.

26. The method of claim 25, wherein a via opening of the dual inlaid interconnect opening is less than approximately 0.1 microns.

27. The method of claim 25, wherein the dual inlaid interconnect opening further comprises a seed layer formed by physical vapor deposition (PVD).

28. The method of claim 27, wherein portions of the seed layer formed on sidewall portions of the dual inlaid interconnect opening adjacent the top dielectric surface and the bottom trench surface are thicker than portions of the seed layer formed on sidewalls in regions closer to the bottom via surface.

29. The method of claim 27, wherein sidewall portions of the dual inlaid interconnect opening between the bottom trench surface and the bottom via surface contain depletion regions which do not contain contiguous seed material.

30. The method of claim 25, wherein an insitu endpoint detection step is performed sometime during formation of the copper layer over the wafer.

31. A method for forming a copper layer over a wafer, the method comprising the steps of:

placing the wafer in an electroplating chamber, wherein the electroplating chamber has a control system that is electrically coupled to the wafer through at least one electrical contact, and wherein the control system provides power to the wafer;

powering the wafer to electroplate copper onto the wafer; and monitoring an electrical property of the wafer during electroplating to determine when to change conditions in the electroplating chamber.

32. The method of claim 31, wherein monitoring an electrical property is further characterized as providing current through the at least one electrical contact and measuring a voltage drop across the wafer.

33. The method of claim 31, wherein monitoring an electrical property is further characterized as providing a voltage potential to the at least one electrical contact and measuring a corresponding current through the wafer.

34. The method of claim 31, wherein powering the wafer and monitoring an electrical property are alternately performed during formation the copper layer through the same clamp mechanism in a time multiplexed manner.

35. The method of claim 31, wherein powering the wafer is performed using a first set of electrical wafer contacts and monitoring an electrical property of the wafer is performed using a second set of electrical wafer contacts, wherein the first set of electrical contacts is different from the second set of electrical contacts.

36. The method of claim 31, wherein powering the wafer is performed using a first set of electrical contacts and monitoring an electrical property is performed using a second set of electrical contacts of the wafer, wherein the first set of electrical contacts includes the second set of electrical contacts.

37. The method of claim 31, wherein monitoring an electrical property and powering the wafer further comprises:

monitoring the electrical property at multiple points across the wafer to determine a uniformity of copper electroplated onto the wafer.

38. The method of claim 37, wherein monitoring an electrical property and powering the wafer further comprises:

powering specific electrical contacts in response to the monitoring the electrical property at multiple points to insitu change the uniformity of copper electroplated onto the wafer.

39. The method of claim 31, wherein powering the wafer is performed using a first set of electrical contacts in a first processing environment and monitoring an electrical property of the wafer is performed using a second set of electrical contacts in a second processing environment, and wherein the wafer is moved between the first processing environment and the second processing environment via robotic control.

40. A method for forming a copper layer over a wafer, the method comprising the steps of:

placing the wafer in an electroplating chamber, the electroplating chamber having an control system, wherein the control system is electrically coupled to the wafer and to an anode, and wherein the control system provides power to the wafer and the anode;

positively powering the wafer to electroplate copper onto the wafer; and pulsing power to the anode to further control an electroplating of copper onto the wafer.

41. The method of claim 40, wherein an insitu endpoint detection step is performed sometime during formation of the copper layer over the wafer.

42. A method for forming a copper layer over a wafer, the method comprising the steps of:

using one or more low-power positive pulsed or alternating current (AC) cycles in a plating chamber to fill a via opening with copper, the via opening having a radius less than 1.0 micron and being filled in a void-free manner; and using a high-powered direct current (DC) cycle in the plating chamber to complete the copper layer over the wafer whereby wafer throughput through the plating chamber is improved.

* * * * *